United States Patent [19]

Allen et al.

[11] Patent Number: 4,794,283
[45] Date of Patent: Dec. 27, 1988

[54] EDGE SENSITIVE LEVEL TRANSLATING AND REREFERENCING CMOS CIRCUITRY

[75] Inventors: Steven P. Allen, Mesa; Robert C. Ledszius, Chandler, both of Ariz.

[73] Assignee: Motorola, Inc., Schaumburg, Ill.

[21] Appl. No.: 54,469

[22] Filed: May 26, 1987

[51] Int. Cl.$^4$ ............................................. H03K 19/094
[52] U.S. Cl. ...................................... 307/475; 307/451; 307/360; 307/291
[58] Field of Search ............... 307/443, 448, 451, 475, 307/517, 360, 553–554, 562, 246, 272 R, 291, 264; 328/127

[56] References Cited

U.S. PATENT DOCUMENTS

| | | |
|---|---|---|
| 4,295,057 | 10/1981 | Hendrickson ................... 307/517 X |
| 4,472,647 | 9/1984 | Allgood et al. ...................... 307/475 |
| 4,490,633 | 12/1984 | Noufer et al. ................... 307/443 X |
| 4,504,747 | 3/1985 | Smith et al. ......................... 307/475 |
| 4,578,601 | 3/1986 | McAlister et al. .................. 307/475 |
| 4,593,212 | 6/1986 | Svager ................................ 307/475 |
| 4,636,654 | 1/1987 | Lach ............................... 307/443 X |

Primary Examiner—Stanley D. Miller
Assistant Examiner—D. R. Hudspeth
Attorney, Agent, or Firm—Maurice J. Jones

[57] ABSTRACT

A logic level translator circuit includes capacitive coupling to facilitate rereferencing and differentiating of input logic signals. An input amplifier having complementary devices is responsive to the differentiated signals to provide control signals to a feedback circuit which holds one of the devices in a conductive state and the other in a non-conductive state to provide an output signal having predetermined logic levels. Threshold voltage generating circuits biases each of the devices.

11 Claims, 2 Drawing Sheets

EDGE SENSITIVE LEVEL TRANSLATING AND REREFERENCING CMOS CIRCUITRY

BACKGROUND OF THE INVENTION

Voltage level translating circuitry is required in many modern day digital electronic systems for shifting the voltage levels of logical "ones" and logical "zeros" provided by logic systems coupled to the input terminal thereof to other magnitudes suitable for driving other kinds of logic systems coupled to the output terminal thereof. For example, such circuitry is required for interfacing transistor-transistor logic (TTL), emitter coupled logic (ECL), NMOS logic or circuitry providing non-conventional digital voltage levels to low threshold, complementary, metal oxide semiconductor (CMOS) circuitry. To perform this function, the translating circuitry must, for example, convert input logical "zero" signals having magnitudes of between 0 and 0.5 volts to a CMOS "zero" level of 0 volts and input logical "one" signals having magnitudes of between 2.4 and 3 volts to a CMOS logical "one" level having a magnitude of 5 volts.

Prior art level translating circuits for performing the digital signal level translations are sometimes preceded by line receivers. Such line receivers are utilized to compensate for the ground potential of the receiving circuitry being at a substantially different potential than the ground level of the remotely located transmitting or sending circuitry. Such line receivers amplify and rereference the incoming signal to the ground potential of the receiving circuitry unit. Moreover, such prior art circuitry may also require photo diodes to provide further isolation between the incoming data line and the receiving circuitry.

Prior art systems including voltage translating, rereferencing and isolating circuitry tends to be complex and expensive. Furthermore, some prior art circuitry is not suitable for being provided in economical, compact and reliable monolithic integrated circuit form such as on a single CMOS integrated circuit chip along with other CMOS circuitry because such prior art circuits cannot compensate for process induced variations in device characteristics from wafer-to-wafer, for instance. In addition, some prior art circuitry for performing digital level translations and ground potential rereferencing requires the use of more than two power supply potentials thereby increasing cost and complexity.

SUMMARY OF THE INVENTION

An object of one aspect of the present invention is to provid improved level translating circuitry for converting the voltage magnitudes representing the logic levels of one logic system to different magnitudes required by another logic system.

Another object of an aspect of the invention is to provide level translating circuitry which can compensate for the input signal thereof being referenced to a different ground potential than the ground potential which references the level translating circuitry.

Still another object is to provide circuitry for providing ground level rereferencing and digital signal level translation which is suitable for being provided along with other circuitry on a single CMOS integrated circuit.

An addttional object is to provide CMOS level translating circuitry which can compensate for processing caused variations from wafer-to-wafer.

A further object is to provide digital signal level translating and rereferencing circuitry which is suitable for operating with power supplies providing only two potential levels.

Briefly, a logic level translating circuit in accordance with one embodiment of the invention includes a capacitive input for differentiating input logic signals to provide transitions having positive and negative going transitions. An input amplifier is connected to the capacitive input and includes a P channel CMOS device and a N channel device. The input electrode of the P channel device receives a first power supply potential and the input electrode of the N channel device receives a second power supply potential. The output electrodes of the P and N channel devices are coupled to the output terminal of the input amplifier. The P channel device is rendered temporarily conductive in response to the negative going transitions and the N channel device is rendered temporarily non-conductive in response to these transitions. As a result, a first control signal is applied through the P channel device to the output terminal of the input amplifier. A feedback circuit coupled to the output terminal of the input amplifier responds to the first control signal to hold the P channel device in a conductive state and the N channel device in a non-conductive state. As a result, the input amplifier provides an output a potential having a magnitude approximately equal to the magnitude of the first power supply potential.

Alternatively, tee N channel device is rendered temporarily conductive and the P channel device is rendered temporarily non-conductive in response to the positive going transitions supplied by the capacitive input to provide a second control signal at the output of the input amplifier. The feedback circuitry responds to this seoond control signal to hold the N channel device in the conductive state and the P channel device in the non-conductive state. As a result, the N channel device conducts a potential to the output terminal of the input amplifier having a magnitude which is approximately equal to the second power supply potential.

A first threshold voltage generating circuit provides a bias potential to the P channel device which is approximately equal to the threshold voltage thereof and a second voltage generating circuit provides a threshold voltage to the N channel device which is approximately equal to the threshold voltage thereof.

DETAILED DESCRIPTION OFTHE PREFERRED EMBODIMENT

Figure 1:
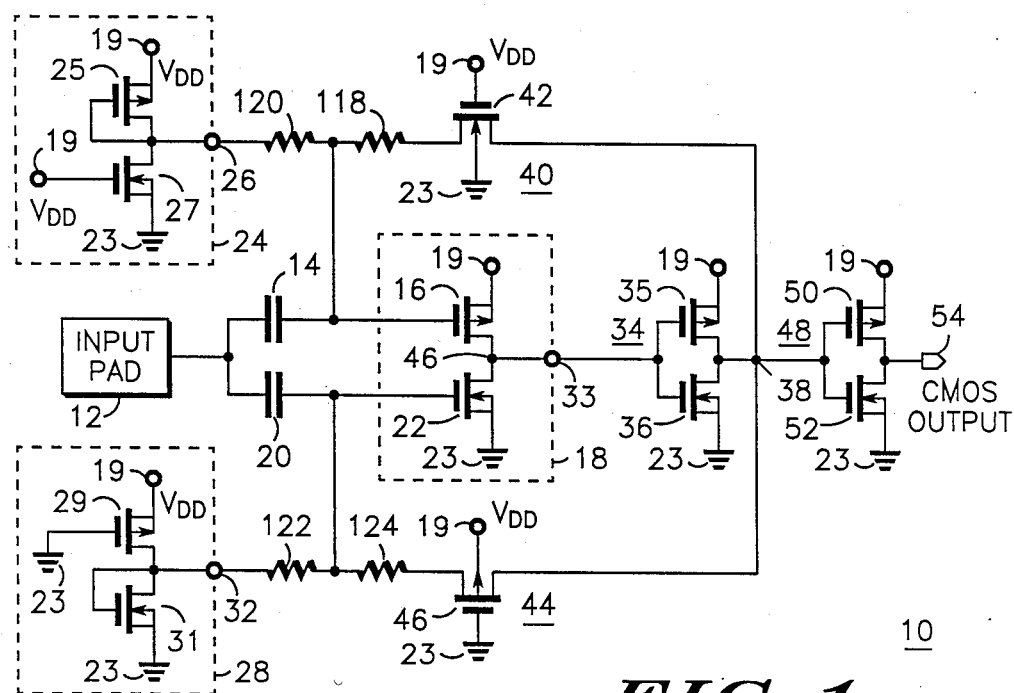
FIG. 1 is a schematic diagram of the voltage level translating and ground potential rereferencing circuitry of one embodiment of the invention.

FIG. 1 shows a level translating and ground rereferencing interface circuit 10 of one embodiment of the invention. As is well-known in the art, a N type or N channel CMOS device or transistor of circuit 10 is rendered conductive by the gate potential thereof rising in a positive manner with respect to the source potential across a threshold voltage which results in an inversion layer being created therein that provides a conductive path between the source and drain electrodes. A P type CMOS device of circuit 10 is rendered conductive by the magnitude of the gate potential thereof crossing a threshold level which is negative with respect to the potential of the source electrode.

Input terminal 12 of circuit 10, which may be a contact pad of an integrated circuit, is coupled through coupling capacitor 14 to the gate or control electrode of P type CMOS device 16 of input amplifier 18. Similarly, coupling capacitor 20 couples input terminal 12 to the gate electrode of N type CMOS device 22 of input amplifier 18. The source or input electrode of device 16 is connected to positive power supply conducor 19 and the drain or output electrode of device 16 is connected to the drain electrode of device 22. The source electrode of device 22 is connected to negative or ground power supply conductor 23.

Threshold generating circuit 24 which includes P type device 25 and N type device 27 provides a bias potential at output terminal 26 thereof having a magnitude, when referenced to the potential on conductor 23, which is approximately equal to the threshold voltage of the P type devices of circuitry 10 in a manner which will be explained. The gate electrode of P type device 16 is coupled to output terminal 26 for receiving this "P" threshold or bias potential. Similarly, threshold generating circuit 28, which includes P type device 29 and N type device 31, provides a "N" bias potential having a magnitude, when referenced to the potential on conductor 23 which is approximately equal to the threshold voltage of th N channel devices of circuitry 10 at output terminal 32. The gate electrode of device 22 is coupled to terminal 32 for receiving this "N" threshold or bias potential.

Output terminal 33 of input amplifier 18 is coupled to node 38 through feedback CMOS inverter 34 of known configuration which includes P type device 35 and N type device 36. First positive feedback circuit branch 40 including N type device 42 is coupled between node 38 and the gate electrode of P type device 16. Similarly, second positive feedback circuit branch 44 including P type device 46 is coupled between node 38 and the gate electrode of N type device 22. These feedback circuits enable the devices of input amplifier 28 to have hysteresis.

Buffer or output amplifier 48 also is a CMOS inverter of known configuration which includes P type device 50 and N type device 52. Amplifier 48 is coupled between node 38 and output terminal 54 to provide electrical isolation therebetween. Load circuitry (not shown) is connected to output terminal 54 for receiving output digital signals having CMOS compatible levels generated in response to input digital signals, which may not have CMOS compatible levels applied to input terminal 12 of circuit 10.

The threshold voltages at which CMOS devices of integrated circuits start to become conductive can vary substantially even for the same manufacturing process on the same manufacturing line because of uncontrollable changes in the process parameters. Such threshold voltages can change from perhaps, 0.2 of a volt to 0.6 of a volt. However, since all of the devices of a particular wafer are exposed to the same manufacturing processes, all of the devices of the same kind on a particular wafer will have substantially the same threshold voltage.

Positive threshold voltage generating circuit 24 develops a "P" bias voltage which has a magnitude that approximates the threshold voltage for the P type devices of a particular wafer. P type device 25 of circuit 24 includes a source electrode connected to positive power supply conductor 19 and a gate electrode connected to the drain thereof. The drain electrode of N type device 27 is connected to the drain electrode of P type device 25. Device 27 further incuudes a gate electrode connected to power supply conductor 19 for receiving the positive power supply potential and a source electrode connected to the ground or reference conductor 23. The commonly connected drain electrodes of devices 25 and 27 are connected to threshold voltage generating circuit output terminal 26.

Figure 2:
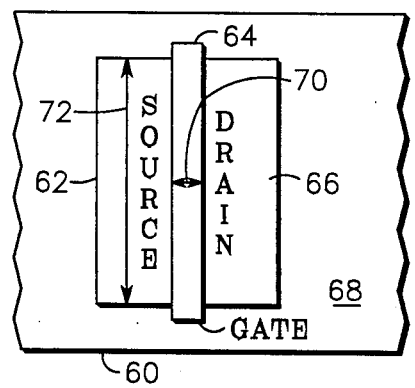
FIG. 2 is a topographical view of a CMOS device utilized in the circuitry of FIG. 1.

FIG. 2 is a topographical view of CMOS device 60 of a known structure wherein area 62 indicates a source region, area 64 indicates a gate region and area 66 indicates a drain region all of which are provided in substrate 68. Distance 70 between the source and drain regions is the channel length and distance 72 across the gate region is the channel width. The transconductance or gain of a CMOS device is generally directly proportional to its channel width and inversely proportional to its channel length. P type devices have P type source and drain regions and N type gate regions and vice versa for N type CMOS devices.

Transistor 27 of threshold generator 24 of FIG. 1 has a small channel width to length ratio as compared to transistor 25. Hence, transistor 27 has a small transconductance as compared to the transconductance of transistor 25. For example, the transconductance of transistor 27 may be approximately 2 micromhos and the transconductance of transistor 25 may be approximately 200 micromhos. Since N type transistor 27 is rendered fully conductive by the positive potential applied to its gate electrode, transistor 27 sinks or draws a source-to-drain current of constant magnitude. However, because device 27 has a small geometry and a small gain, this current will have a small magnitude. Hence, P type transistor 25 is able to provide the current drawn by transistor 27 by only slightly turning on. Accordingly, the magnitude of the voltage between the gate and source electrodes of P type transistor 25 is approximately equal to the threshold voltage of the particular P type devices provided in the particular CMOS integrated circuit including the circuitry of FIG. 10. This threshold voltage may be different for other P type devices provided from other wafers. Thus, the voltage between output terminal 26 and positive power supply terminal 19 is at the "P" threshold voltage for P devices of any particular circuit and thereby biases transistor 16 of amplifier 18 at its threshold voltage during quiescent conditions.

Negative threshold voltage generating circuit 28 operates in a similar manner wherein P type transistor 29 includes a source electrode connected to positive power supply conductor 19, a gate electrode connected to reference or ground conductor 23 and a drain electrode connected to the drain electrode of N type transistor 31. The source electrode of transistor 31 is connected to ground conductor 23 and the gate electrode of transistor 31 is connected to the commonly connected drain electrodes. Transistor 29 has a relatively small channel width to length ratio as compared to transistor 31 and therefore a small gain as compared to the gain of transistor 31. The configuration of P type transistor 29 is arranged such that whnn rendered fully conductive by its negative gate-to-source potential, transistor 29 draws or sinks a current having a small constant magnitude which transistor 31 supplies by being rendered slightly conductive. Hence, transistor 31 generates the threshold voltages for the N type devices of circuit 10 between its gate and source electrodes which are coupled in parallel with the gate and source electrodes of N type device 22 of input amplifier 18 to provide bias for device 22.

Accordingly, if the action of feedback loop branches 40 and 44 is ignored for purposes of explanation, transistors 16 and 22 of input amplifier 18 are rendered equally and slightly conductive by the bias potential provided circuits 24 and 28. Thus, a potential would be established at terminal 33 about halfway between the positive supply potential of conductor 19 and the ground potential of conductor 23.

Transistors 35 and 36 of feedback inverter 34 have commonly connected gate electrodes which are connected to output terminal 33 and commonly connected drain electrodes connected to inverter output terminal 38. The source electrode of P type transistor 35 is connected to the positive power supply conductor 19 and the source electrode of N type transistor 36 is connected to ground potential conductor 23. Thus, again ignoring the operation of feedback loop branches 40 and 44, during quiescent conditions transistors 35 and 36 would both be rendered conductive by the voltage at ottput terminal 33 thereby providing a voltage at node 38 which is approximately equal to the magnitude of the voltage of terminal 33.

Output inverter 48 has a configuration identical to the configuration of feedback inverter 34 and, accordingly could provide a quiescent voltage at output terminal 54 which is about halfway between the positive potential on conductor 19 and the reference potential on terminal 23.

Thus, assuming no input signal is applied to terminal 12, bias conditions within circuit 10 would cause the devices of circuit 10 to be conductive thus enabling the inverter to waste an undesirable amount of current.

Feedback branches 40 and 44 provide positive feedback to the gate electrodes of transistors 16 and 22, respectively, so that one of them will be forced on and the other one will be forced off during quiescent or start up conditions. Accordingly, one of transistors 35 and 36 of inverter 34 and one of transistors 50 and 52 of inverter 48 will accordingly be forced on and the other of the transistors will be forced off during quiescent or start up conditions so that electrical power is conserved.

Figure 3:
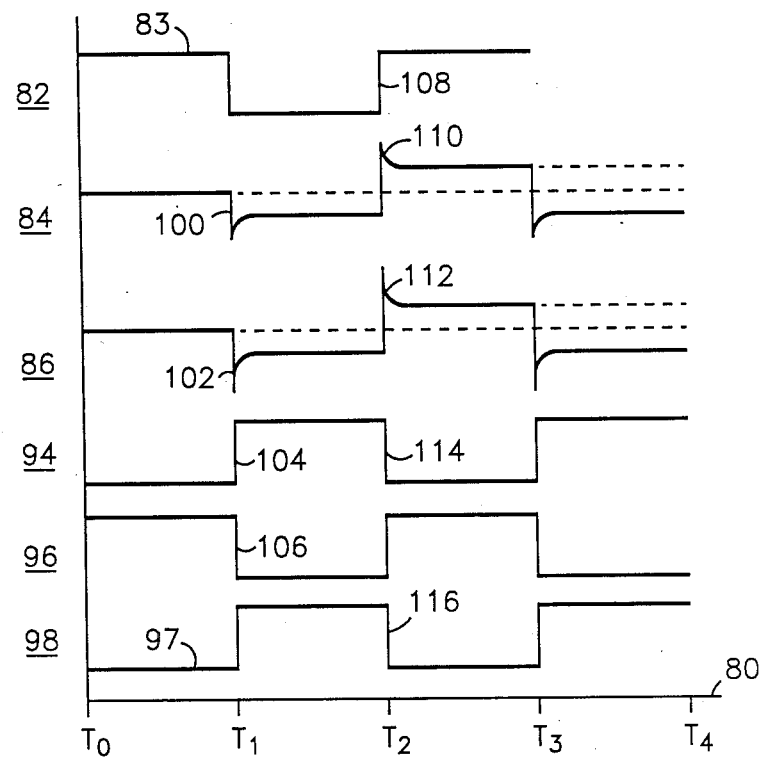
FIG. 3 is a timing diagram illustrating the operation of the circuitry of FIG. 1.

FIG. 3 illustrates a timing diagram useful in understanding the operation of circuit 10. Time is indicated along abscissa axis 80. Waveform 82 represents the waveform of an input data or digital signal applied to input terminal 12 and is shown to be at an initially high state at time $T_0$ by portion 83 of waveform 82. Waveform 82 could be referenced to an entirely different reference potential than that provided to terminal 23 and, for instance, could be swinging between a low level of $-50$ volts and a high level of $+50$ volts as referenced to the potential on conductor 23. Waveform 82 also could have a relative voltage swing of as little as 0.5 volts or as much as 100 volts between its one and zero logic levels, for instance, thereby making it unsuitable for driving CMOS circuits which require a "zero" logic level of 0 volts and a "one" logic level of 5 volts.

Waveforms 84 and 86 indicate the respective signals applied by capacitors 14 and 20 to the gate electrodes of transistors 16 and 22 of input amplifier 18 in response to capacitors 14 and 20 differentiating input signal 82. Capacitors 14 and 20 block the direct current level of input signal 82.

Waveform 94 represents the signal that occurs at node 33 and which an inverted polarity as compared to input signal 82. Waveform 96 represents the signal at terminal 38 which has an inverted polarity with respect to signal 94 and, hence, the same polarity as waveform 82. Waveform 98, which occurs at output terminal 54, is inverted with respect to waveform 96.

The high levels of waveforms 84 and 86 at time $T_0$ will respectively render transistor 16 non-conductive and transistor 22 conductive so that a low level will occur at node 33. This low level will have a magnitude approximately equal to the potential on conductor 23 regardless of the magnitudes of signals 82, 84, or 86. As a result, transistor 35 is rendered conductive and transistor 36 is rendered non-conductive to provide the high level at terminal 38 as shown by waveform 96. This high level will have a magnitude approximately equal to the potential on conductor 19. Accordingly, transistor 52 is rendered conductive and 50 is rendered non-conductive so that the output signal on node 54 is at a low level approximately equal to the potential on conductor 23, as indicated by portion 97 of waveform 98.

At time $T_1$, input voltage level 82 falls from a high level to a low level. Accordingly, input capacitors 14 and 20 differentiate this voltage by providing negative going spikes or transitions 100 and 102 which initially turn P channel device 16 on and turn N channel device 22 off. Thus, device 16 applies a high level voltage to terminal 33, as indicated by portion 104 of waveform 94, which renders device 36 conductive and device 35 nonconductive. As a result a low level control signal occurs at terminal 38 as indicated by portion 106 of waveform 96. This low level control signal renders feedback transistor 42 conductive which latches or keeps device 16 on between times $T_1$ and $T_2$. Moreover, this low level control signal renders feedback device 46 non-conductive which latches or holds device 22 off between times $T_1$ and $T_2$. Thus, feedback branches 40 and 44 provide hysteresis. Output inverter 48 changes the level of the output signal at time $T_1$ as indicated by Waveform 98.

At time $T_2$, input signal 82 returns to a high or "one" level as indicated by portion 108 thereof. Accordingly, capacitors 14 and 20 provide positive going spikes or transitions 110 and 112 to respective gate electrodes of transistors 16 and 22. Accordingly, device 16 is initially rendered non-conductive and device 22 is initially rendered conductive thereby providing a negative going control signal at terminal 33 as illustrated by portion 114 of waveform 94. Accordingly, feedback inverter 44 changes state and feedback branches 40 and 44 operate to maintain transistor 16 off and transistor 22 on. Output inverter 48 responds to the change in voltage at terminal 38 to change state thereby causing the output waveform to change levels at time $T_2$ as indicated by portion 116 of waveform 98.

Because of fluctuations in processing parameters, the gains of the transistors of circuit 10 also tend to change from wafer-to-wafer. Hence, the magnitude of the feedback signals conducted by branches 42 and 44 also tend to vary with the gains of transistors 42 and 44 from wafer-to-wafer. For instance, the change in gain could cause the feedback voltage magnitude to change between 0.2 of a volt and 0.6 of a volt between best case and worst case processing. Optional resistor 118 can be connected between the drain electrode of feedback transistor 42 and the gate electrode of transistor 16 and optional resistor 120 can be connected between output terminal 26 of threshold circuit 24 and the gate electrode of transistor 16. Similarly, optional resistor 124 can be connected between the drain of feedback transistor 46 and the gate of transistor 22 and optional resistor 122 can be connected between output terminal 32 and the gat of transistor 22. These resistors can be fabricated from polycrystalline silicon and have a resistance that varies only about 20% from wafer-to-wafer rather than the 300% variation in the gain of devices 42 and 44, for example. Hence, these resistors tend to stabilize the variations in the magnitude of the feedback voltage by providing a summing of the magnitude of the feedback signal and the threshold voltages. Resistors 118, 120, 122 and 124 are necessary only if the circuit 10 must operate under very stringent conditions.

What has been described therefore is a level translating and ground level rereferencing circuit suitable for converting the voltage magnitudes of non CMOS logic levels of to the magnitudes required by CMOS logic systems. On chip capacitors 14 and 20 block the direct current level of the incoming signal to thereby enable circuitry 10 to be substantially immune to the reference level of the input signal applied to input terminal 12 and to rereference the incoming data to the potential on conductor 23. The magnitude of the high level logic potential on nodes 33, 38 are output terminal 54 of circuit 10 are approximately equal to the potential on conductor 19 and the magnitudes of the low level logic potentials on nodes 33, 38 and output terminal 54 an approximately equal to the potential on conductor 23. Thus, the levels of the input signal can be translated to selected levels by selecting the potentials on conductors 19 and 23 which for CMOS may respectively be 5 volts and 0 volts. Circuitry 10 is suitable for being economically provided on a single CMOS integrated circuit chip with other CMOS circuitry, threshold voltage generating circuits 24 and 28 compensate for process induced variations in the thresholds of CMOS devices from wafer-to-wafer. Optional resistors 118, 120, 122 and 124 compensate for process induced variations in gain from wafer-to-wafer. Also, circuitry 10 operates with a power supply providing only two potential levels on conductors 23 and 19.

We claim:

1. A logical level translating circuit including in combination:
capacitive input means coupled for receiving an input logic signal having a direct current level, said capacitive means differentiating said input logic signal to provide positive and negative transitions;
input amplifier means having an input terminal and an output terminal, said input terminal being coupled to said capacitive input means, said input amplifier means further including a first normally non-conductive device of a first conductivity type having a threshold voltage of a first polarity, said first device being coupled between said input and output terminals of said input amplifier means, said first device being rendered temporarily conductive in response to one of said positive and negative transitions traversing said threshold voltage thereof to provide a first ocntrol signal at said output terminal of said input amplifier means;
first threshold volatge generating circuitry coupled to said first device for providing a bias voltage thereto having a magnitude substantially equal to the magnitude of said threshold voltage of said first device; and
feedback circuit means coupled between said output terminal and said input terminal of said input amplifier means, said feedback circuit means providing a first feedback signal for holding said first device in said conductive state in response to said first control signal, said first device thereby providing a first predetermined potential to said output terminal of said input amplifier means in respnnse to said one of said positive and negative transitions.

2. The logic level translating circuit of claim 1 further including a second device of a second conductivity type coupled between said input and output terminals of said input amplifier means;
said second device being rendered temporarily conducitve in response to the other of said positive and negative transitions to provide a second control signal at said output terminal of said input amplifier means; and
said feedback circuit means providing a second feedback signal for holding said second device in said conductive state in response to said second control signal, said second device thereby providing a second predetermined potential to said output terminal of said input amplifier means in response to said other of said positive and negative transitions.

3. The logic level translating circuit of claim 2 wherein:
said second device is normally non-conductive but is rendered conductive by input signals crossing a threshold voltage thereof of a second polarity; and
second threshold voltage generating circuitry being coupled to said second device for providing a bias voltage thereto having a magnitude substantially equal to the magnitude of said threshold voltage of said second device.

4. The logic level translating circuit of claim 2 wherein said first and second devices respectively include N channel and P channel complementary metal oxide semiconductor transistors.

5. The logic level translating circuit of claim 1 further including output amplifier means coupled to said output terminal of said input amplifier means.

6. A logic level translating circuit suitable for being provided in complementary metal oxide semiconductor integrated circuit form including in combination:
capacitive input means for differentiating an input logic signal to provide positive and negative transitions;
first power supply conductor for providing a first potential of a first predetermined magnitude;
second power supply conductor for providing a second potential of a second predetermined magnitude;
input amplifier means having an input terminal and an output terminal, said input terminal being coupled to said capacitive input means, said input amplifier means further including a P channel device and an N channel device each having input, output and control electrodes, said control electrodes of said N channel and said P channel devices being coupled to said capacitive input means, said input electrode of said P channel device being connected to said first power supply conductor, said input electrode of said N channel device being connected to said second power supply conductor, said output electrodes of said P channel device and said N channel device being coupled to said output terminal of said input amplifier means;

said P channel device being rendered temporarily conductive in response to said negative transitions and said N channel device being rendered temporarily non-conductive in response to said negative transitions to provide a first control signal at said output terminal of said input amplifier means; and feedback circuit means coupled between said output terminal of said input amplifier means and said control electrodes of said P channel device and said N channel device, said feedback circuit means including first branch means having a second N channel device coupled between said output terminal of said input amplifier means and said control electrode of said P channel device and second branch means including a second P channel device coupled between said output terminal of said input amplifier means and said control electrode of said N channel device, said feedback circuit means providing a first positive feedback signal forhholding said P channel device in said conductive state and said N channel device in said non-conductive state in response to said first control signal so that said P channel device provides a first translated output potential at said output terminal of said input amplifier means, said first translated output potential being substantially equal to the potential on said first power supply conductor.

7. The logic level translating circuit of claim 6 wherein said N channel device is rendered temporarily conductive in response to said positive transitions and said P channel device is rendered temporarily nonconductive in response to said positive transitions to provide a second control signal at said output terminal of said input amplifier means; and said feedback circuit means being responsive to said second control signal to provide a second positive feedback signal for holding said N channel device in said conductive state of said P channel device in said non-conducitve state so that N channel device provides a second translated output potential at said output terminal of said input amplifier means, said second translated output potential being substantially equal to the potential on said second power supply conductor.

8. The logic level translating circuit of claim 6 further including:

first circuit means having an input terminal and an output terminal, said input terminal of said first circutt means being coupled to said output terminal of said input amplifier means; and wherein said first circuit means includes an inverter means.

9. The logic level translating circuit of claim 6 wherein:

said P channel device is normally non-conductive but is rendered conductive in response to an input signal having a magnitude exceeding a threshold voltage hhereof of a first polarity;

said N channel device is normally non-conductive but is rendered conductive in response to an input signal applied thereto having a magnitude exceeding a threshold voltage thereof a second polarity;

first threshold voltage gnnerating circuit being coupled to said P channel device for providing a bias voltage to said P channel device having a magnitude substantially equal to the magnitdue of said threshold voltage of said P channel device; and second threshold voltage generating circuit being coupled to said N channel device for providing a bias voltage to said N channel device having a magnitude substantially equal to the magnitude of said threshold voltage of said N channel device.

10. The logic level translating circuit of claim 9 wherein:

said first threshold voltage generating circuit includes an additional P channel device and an additional N channel device, each having input, output and control electrodes;

said input electrode of said additional P channel device being connected to said first power supply conductor, said control electrode of said additional P channel device being connected to said output electrode of said additional P channel device and to said output electrode of said additional N channel device;

said control electrode of said additional N channel device being connected to said first power supply conductor, said input electrode of said additional N channel device being connected to said second power supply conductor and said output electrode of said additional N channel device being connected to said output electrode of said additional P channel device; and the geometry of said additional N and P channel devices being arranged such that additional N channel device has a small transconductance compared to the transconductance of said additional P channel device so that the threshold voltage or said additional P channel device is created at said commonly connected output electrodes of said additional N and P channel devices.

11. The logic level translating ciruit of claim 9 wherein:

said second threshold voltage generating circuit includes an additional P channel device and an additional N channel device each having input, output and control electrodes;

said input electrode of said additional N channel device being connected to said second power supply conductor, said control electrode of said additional N channel device being connected to said output electrode of said additional N channel device and to said output electrod of said additional P channel device;

said control electrode of said additional P channel device being connected to said second power supply ocnductor, said input electrode of said additional P channel device being connected to said first power supply conductor, and said output electrode of additional P channel device being connected to said output electrode of said additional N channel device; and the geometry of said additional N and P channel devices being arranged such that said additional P channel device has a small transconductance compared to the transconductance of said additional N channel device so that the threshold voltage of said additional N channel device is created at said commonly connected drain electrodes of said additional N and P channel devices.

* * * * *

UNITED STATES PATENT AND TRADEMARK OFFICE
CERTIFICATE OF CORRECTION

PATENT NO. : 4,794,283

DATED : December 27, 1988

INVENTOR(S) : Steven P. Allen et al.

It is certified that error appears in the above-identified patent and that said Letters Patent is hereby corrected as shown below:

In column 8, claim 1, line 11, the word "respnnse" should be --response--.
In column 9, claim 9, line 61, the word "hhereof" should be --thereof--.
In column 9, claim 9, line 65, insert the word --of-- after the word "thereof".
In column 10, claim 10, line 34, the word "or" should be --of--.
In column 10, claim 11, line 49, the word "electrod" should be --electrode--.
In column 10, claim 11, line 53, the word "ocnductor" should be --conductor--.

Signed and Sealed this

Second Day of May, 1989

Attest:

DONALD J. QUIGG

Attesting Officer

Commissioner of Patents and Trademarks